US009041074B2

(12) United States Patent
Hong et al.

(10) Patent No.: US 9,041,074 B2
(45) Date of Patent: May 26, 2015

(54) MULTILAYERED CIRCUIT TYPE ANTENNA PACKAGE

(75) Inventors: Won-bin Hong, Seoul (KR); Alexander Goudelev, Suwon-si (KR); Kwang-hyun Baek, Anseong-si (KR); Young-hwan Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 13/531,120

(22) Filed: Jun. 22, 2012

(65) Prior Publication Data

US 2013/0099389 A1 Apr. 25, 2013

(30) Foreign Application Priority Data

Oct. 19, 2011 (KR) ........................ 10-2011-0107059

(51) Int. Cl.
*H01L 29/66* (2006.01)
*H01L 23/34* (2006.01)
*H01Q 1/38* (2006.01)
*H01Q 5/00* (2006.01)
*H01Q 9/04* (2006.01)
*H01Q 1/22* (2006.01)
*H01Q 21/00* (2006.01)

(52) U.S. Cl.
CPC ......... *H01Q 1/2283* (2013.01); *H01Q 21/0025* (2013.01)

(58) Field of Classification Search
USPC ............................ 257/275, 728; 343/700 MS
See application file for complete search history.

(56) References Cited

U.S. PATENT DOCUMENTS

| | | | | |
|---|---|---|---|---|
| 7,405,477 | B1 * | 7/2008 | Tao et al. | 257/728 |
| 7,675,465 | B2 | 3/2010 | Doan et al. | |
| 7,830,312 | B2 | 11/2010 | Choudhury et al. | |
| 2003/0020173 | A1 * | 1/2003 | Huff et al. | 257/774 |
| 2005/0195110 | A1 * | 9/2005 | Lin et al. | 343/700 MS |
| 2009/0256752 | A1 | 10/2009 | Akkermans et al. | |
| 2011/0057853 | A1 | 3/2011 | Kim et al. | |

OTHER PUBLICATIONS

L. J. Chu, "Physical Limitations of Omnidirectional Antennas," Massachusetts Institute of Technology: Research Laboratory of Electronics; Technical Report No. 64, May 1, 1948, pp. 1-21.

* cited by examiner

*Primary Examiner* — Steven Loke
*Assistant Examiner* — Juanita B Rhodes
(74) *Attorney, Agent, or Firm* — Sughrue Mion, PLLC

(57) ABSTRACT

A multilayered antenna package including: a radio frequency integrated circuit (RFIC) interface layer that is configured to transmit a radio frequency (RF) signal; a first dielectric layer that is disposed on the RFIC interface layer; a coplanar waveguide layer that is disposed on the first dielectric layer and is configured to receive the RF signal transmitted by RFIC layer; a second dielectric layer disposed on the coplanar waveguide layer; and an antenna portion that is disposed on the second dielectric layer and is configured to irradiate a signal that is transmitted from the coplanar waveguide layer.

18 Claims, 6 Drawing Sheets

MULTILAYERED CIRCUIT TYPE ANTENNA PACKAGE

CROSS-REFERENCE TO RELATED PATENT APPLICATION

This application claims priority from Korean Patent Application No. 10-2011-0107059, filed on Oct. 19, 2011, in the Korean Intellectual Property Office, the disclosure of which is incorporated by reference herein in its entirety.

BACKGROUND

1. Field

Apparatuses, devices, and articles of manufacture consistent with the present disclosure relate to a multilayered antenna package for millimeter band communication.

2. Description of the Related Art

Millimeter band communication, which is being developed for transmission of large capacity audio/video (AV) data at high speeds on the order of gigabits per second (GBps), is capable of transmitting large capacity data several times faster than near field or middlefield communication methods such as Wireless Fidelity (WiFi), wireless local area network (WLAN), wireless personal area network (WPAN), etc.

Unlike the related art near field or middlefield communication methods that use cables to provide connections, in millimeter band communication it is difficult to use a cable connection method due to the high frequencies involved. In millimeter bands, signal attenuation is several tens of times larger than conventional, commercialized frequency bands. Also, millimeter band-exclusive signal cables are usually several tens of dollars, and thus, the high price is an obstacle for commercialization of 60 GHz communication modules. Accordingly, in millimeter bands, it is advantageous to provide components at the shortest distance to reduce signal loss and attenuation.

In the related art, to implement millimeter band antenna/packages, a method in which a strip lines or microstrip lines are mounted in a multilayered circuit is widely used. This method realizes a wide bandwidth in millimeter bands by implementing a transverse electro magnetic (TEM) mode which is necessary for broadband signal wiring.

The multilayered circuit method in which the strip line or microstrip is used is advantageous to achieving good performance of the multilayered circuit at millimeter bands. However, a strip line requires at least three layers and a microstrip line requires at least two layers. Accordingly, in a multilayered circuit that includes components in addition to the strip line or microstrip line, the number of stacked layers can increase to seven to ten layers. In a low temperature co-fired ceramic (LTCC) process for implementing these multilayered structures, the high manufacturing costs thereof are an obstacle in commercializing millimeter band communication technology.

SUMMARY

Exemplary embodiments provide a multilayered antenna package for millimeter band communication in which the number of stacked layers is minimized.

According to an aspect of an exemplary embodiment, there is provided a multilayered antenna package including a radio frequency integrated circuit (RFIC) interface layer that is configured to transmit a radio frequency (RF) signal; a first dielectric layer that is disposed on the RFIC interface layer; a coplanar waveguide layer that is disposed on the first dielectric layer and is configured to receive the RF signal transmitted by RFIC layer; a second dielectric layer disposed on the coplanar waveguide layer; and an antenna portion that is disposed on the second dielectric layer and is configured to irradiate a signal that is transmitted from the coplanar waveguide layer.

The coplanar waveguide layer may comprise a signal line and a grounding portion that is separated from the signal line. The grounding portion may be formed to surround the signal line with an interval from the signal line.

A first end of the signal line may be electrically coupled to the RFIC interface layer, and a second end of the signal line may be electrically coupled to the antenna portion.

The RFIC interface layer may be disposed on a lower surface of the first dielectric layer, and the multilayered antenna package may further comprise a conductive via that passes through the first dielectric layer to connect the first end of the signal line to the RFIC layer.

The multilayered antenna package may further comprise a third dielectric layer disposed under the RFIC interface layer; and a power line disposed on a lower surface of the third dielectric layer. The RFIC interface layer may be disposed on a lower surface of the third dielectric layer. The multilayered antenna package may further comprises a conductive via that passes through the first dielectric layer and the third dielectric layer to connect the RFIC interface layer and the first end of the signal line.

The first dielectric layer, the second dielectric layer, and the third dielectric layer may be formed of a FR4 material.

The signal line may supply a signal from the RFIC interface layer to the antenna portion via a direct feeding method or a coupling feeding method.

The antenna portion may be configured to irradiate a signal of a millimeter wavelength band.

The antenna portion may be formed of an array of a plurality of antennas, and the coplanar waveguide layer may comprise a plurality of signal lines corresponding to the plurality of antennas and a grounding portion formed to surround the plurality of signal lines with an interval from the plurality of signal lines.

The multilayered antenna package may further comprise a heat sink.

BRIEF DESCRIPTION OF THE DRAWINGS

The above and/or other aspects will become more apparent by describing in detail exemplary embodiments with reference to the attached drawings in which.

DETAILED DESCRIPTION

Figure 1:
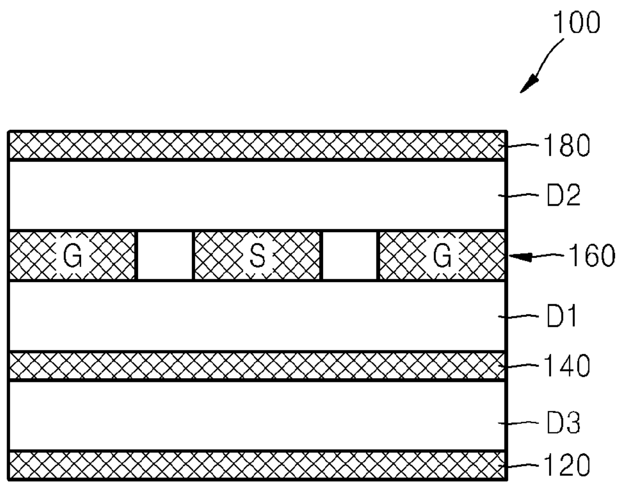
FIG. 1 is a schematic diagram illustrating an arrangement of a multilayered antenna package in which the number of stacked layers is minimized, according to an exemplary embodiment.

Exemplary embodiments will now be described more fully with reference to the accompanying drawings. In the drawings, like reference numerals denote like elements, and the sizes of elements in the drawings may be exaggerated for clarity and convenience.

Figure 2:
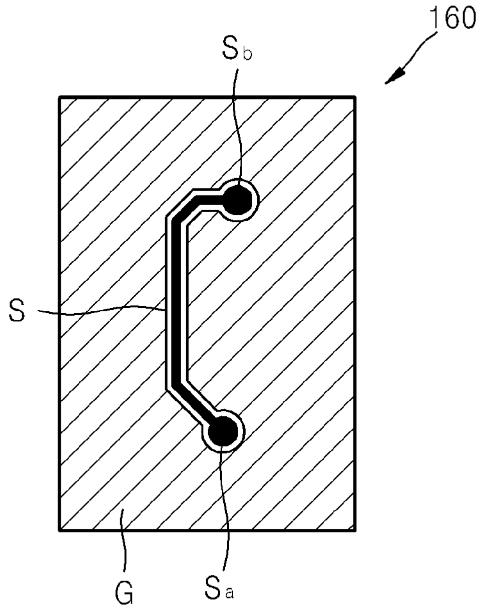
FIG. 2 is a plan view illustrating an exemplary arrangement of a signal line and a grounding portion of a co-planar waveguide (CPW) layer of the multilayered antenna package of FIG. 1.

FIG. 1 is a schematic diagram schematically illustrating an arrangement of a multilayered antenna package in which the number of stacked layers is minimized, according to an exemplary embodiment. FIG. 2 is a plan view illustrating an exemplary arrangement of a signal line S and a grounding portion G of a coplanar waveguide (CPW) layer of the multilayered antenna package of FIG. 1.

Referring to FIG. 1, a multilayered antenna package 100 includes a CPW layer 160 formed on a first dielectric layer D1, and an antenna portion 180 formed on the CPW layer 160, and a radio frequency integrated circuit (RFIC) interface layer 140 formed under the CPW layer 160. The antenna portion 180 is formed on a second dielectric layer D2 disposed on the CPW layer 160, and the RFIC interface layer 140 may be formed on a lower surface of the first dielectric layer D1. Also, a power line 120 may be further formed below the RFIC interface layer 140 with a third dielectric layer D3 therebetween. The positions of the RFIC interface layer 140 and the power line 120 may be exchanged.

The CPW layer 160 is a feed line that is used to transmit a radio frequency (RF) signal from the RFIC interface layer 140 to the antenna portion 180, and has a structure in which a signal line S and a grounding portion G are formed on the same plane. Referring to FIG. 1, the CPW layer 160 is formed on an upper surface of the first dielectric layer D1. The grounding portion G may surround the signal line S with an interval from the signal line S, as illustrated in FIG. 2. A first end Sa of the signal line S is electrically coupled to the RFIC interface layer 140, and a second end Sb of the signal line S is electrically coupled to the antenna portion 180. However, the detailed connection is not illustrated in FIG. 1. For example, a conductive via CV (not shown) that passes through the first dielectric layer D1 may be formed between the signal line S and the RFIC interface layer 140.

The CPW layer 160 is proposed to minimize the number of stacked layers of the multilayered antenna package 100. A related art strip line type feed line includes three layers which are a signal line and grounding lines on and under the signal line, and a related art microstrip type feed line includes two layers which are a signal line and a grounding line that is disposed on or under the signal line. By contrast, the CPW layer 160 according to the current exemplary embodiment consists of a single layer. The related art strip line and the related art microstrip may transmit signals in a transverse electro-magnetic (TEM) mode and a quasi-TEM mode, respectively, and are widely used for broadband signals. On the other hand, for a related art co-planar waveguide, signal transmission in a TEM mode is generally impossible. However, according to the current exemplary embodiment, the antenna portion 180 and the RFIC interface layer 140 formed on and under the CPW layer 160, respectively, function as shields so that signals may be transmitted in a TEM mode.

The antenna portion 180 irradiates signals transmitted from the CPW layer 160 in the form of a wireless signal, and is configured to have an appropriate pattern for a signal frequency. For example, the antenna portion 180 may be configured to irradiate a signal of a millimeter wavelength band, that is, about 60 GHz.

The first dielectric layer D1, the second dielectric layer D2, and the third dielectric layer D3 may be formed of various insulating materials such as ceramic or a FR4 material.

Figure 3:
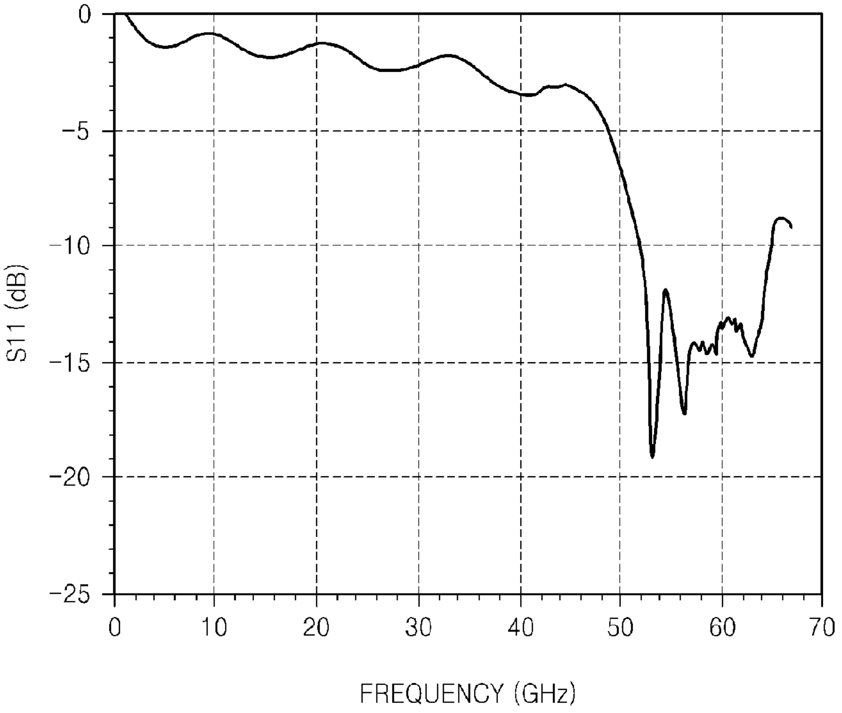
FIG. 3 is a S11 graph showing antenna frequency band performance of the multilayered antenna package of FIG. 1.
Figure 4:
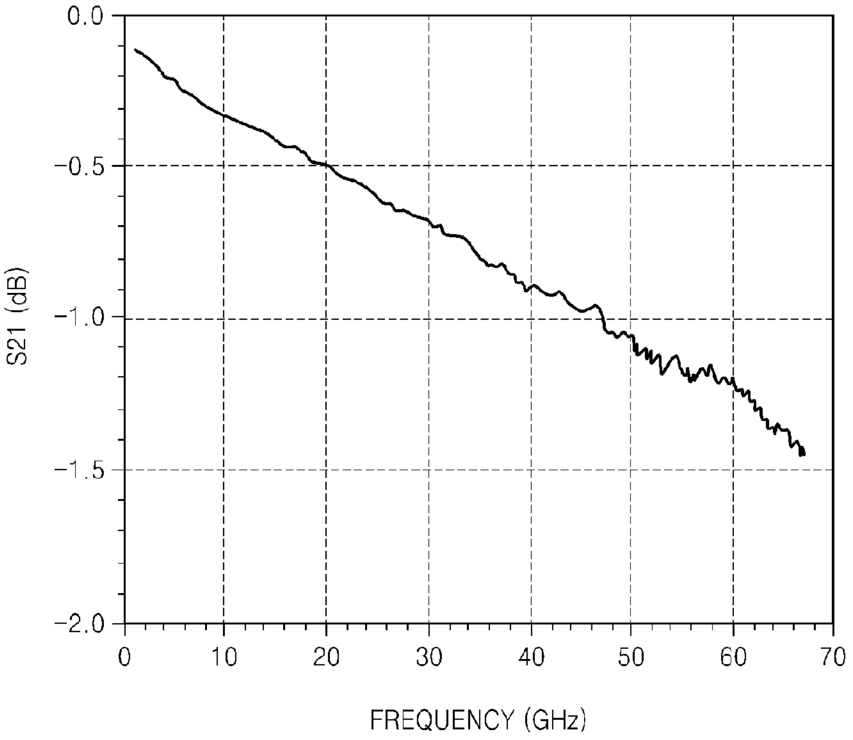
FIG. 4 is a S21 graph showing signal loss of the multilayered antenna package of FIG. 1.

FIG. 3 is a S11 graph showing antenna frequency band performance of the multilayered antenna package 100 of FIG. 1. FIG. 4 is a S21 graph showing signal loss of the multilayered antenna package 100 of FIG. 1. Referring to the graphs, a bandwidth of about −10 dB or less shown in the graph S11 and loss shown in the graph S21 satisfy the specifications for the 60 GHz communication method.

Figure 5:
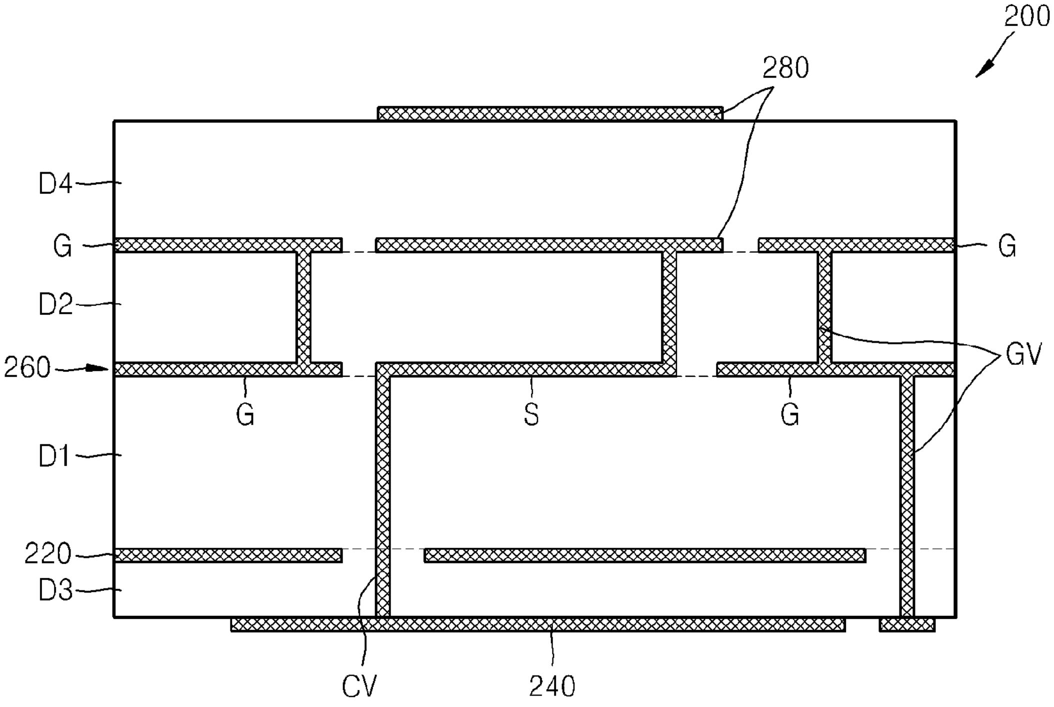
FIG. 5 is a cross-sectional view schematically illustrating a structure of a multilayered antenna package according to another exemplary embodiment.

FIG. 5 is a cross-sectional view schematically illustrating a structure of a multilayered antenna package according to another exemplary embodiment.

Referring to FIG. 5, the multilayered antenna package 200 includes a CPW layer 260 formed on a first dielectric layer D1, a second dielectric layer D2 disposed on the CPW layer 260, an antenna portion 280 disposed on the second dielectric layer D2, a power line 220 for supplying power to the RFIC interface layer formed on a lower surface of the first dielectric layer D1, a third dielectric layer D3 formed on a lower surface of the power line 220, and an RFIC interface layer 240 formed on a lower surface of the third dielectric layer D3.

The first dielectric layer D1, the second dielectric layer D2, and the third dielectric layer D3 may be formed of various insulating materials such as ceramic or a FR4 material.

The antenna portion 280 has a two-layer structure including a fourth dielectric layer D4 interposed between the two layers. However, the antenna portion 280 is not limited thereto, and may also be formed of a single layer or three or more layers. The fourth dielectric layer D4 may be formed of various insulating materials, and the material may be different from the materials of the first dielectric layer D1, the second dielectric layer D2, and the third dielectric layer D3. For example, considering the performance of the antenna portion 280, the fourth dielectric layer D4 may be formed of a material having a low dielectric loss.

The CPW layer 260 includes a signal line S and a grounding portion G formed on the same plane. The grounding portion G may be connected to another grounding portion G disposed on an upper surface of the second dielectric layer D2 via a ground via GV. While signal supply to the antenna portion 280 using a direct feeding method via the signal line S is illustrated in FIG. 5, the feeding method is not limited thereto. For example, a signal may be supplied to the antenna portion 280 via the signal line S using a coupling feeding method. The signal line S may also be connected to the RFIC interface layer 240 via a conductive via CV that passes through the first dielectric layer D1 and the third dielectric layer D3. The positions and number of conductive and ground vias CV and GV are not limited as illustrated and may be modified variously.

Figure 6:
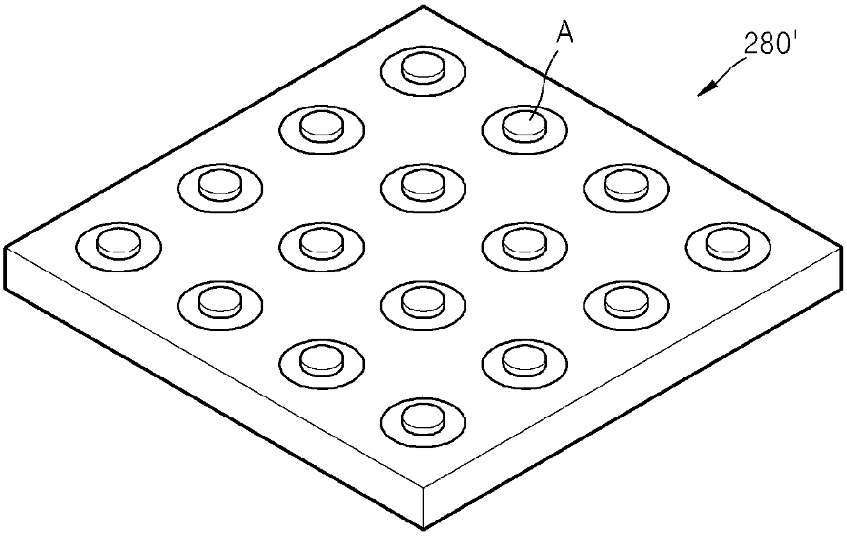
FIG. 6 illustrates an exemplary arrangement of an antenna portion to be applied to the multilayered antenna package of FIG. 5.
Figure 7:
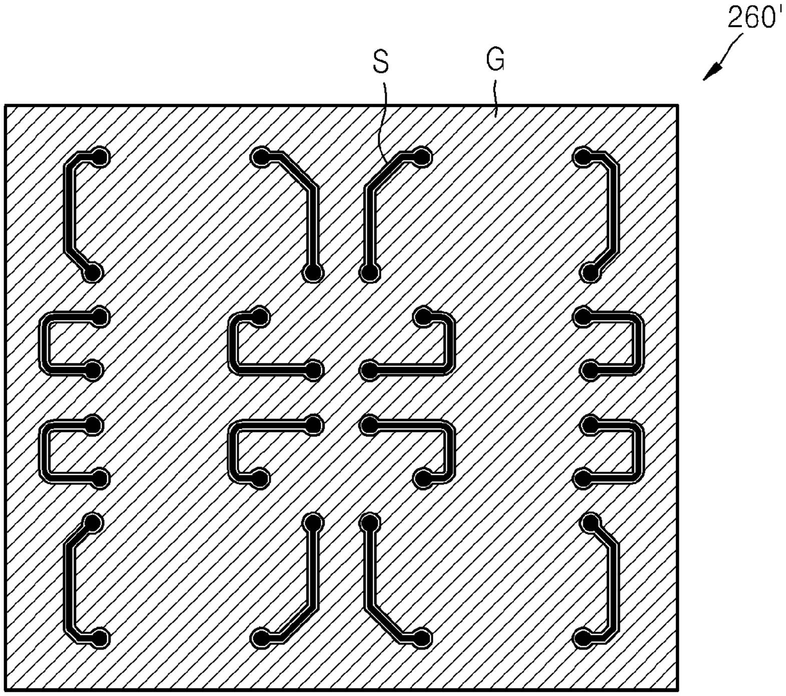
FIG. 7 is a plan view illustrating an exemplary structure of a signal and a ground portion of a CPW layer corresponding to the antenna portion of FIG. 6.

FIG. 6 illustrates an exemplary arrangement of an antenna portion to be applied to the multilayered antenna package 200 of FIG. 5. FIG. 7 is a plan view illustrating an exemplary structure of a signal line S and a grounding portion G of a CPW layer corresponding to the antenna portion of FIG. 6.

Referring to FIG. 6, an antenna portion 280' may be formed of an array of antennas A, but the arrangement and number of antennas are not limited to those shown.

Referring to FIG. 7, a CPW layer 260' includes a plurality of signal lines S respectively corresponding to the plurality of antennas A of the antenna portion 280' of FIG. 6. The grounding portion G is formed to surround the plurality of signal lines S.

Figure 8:
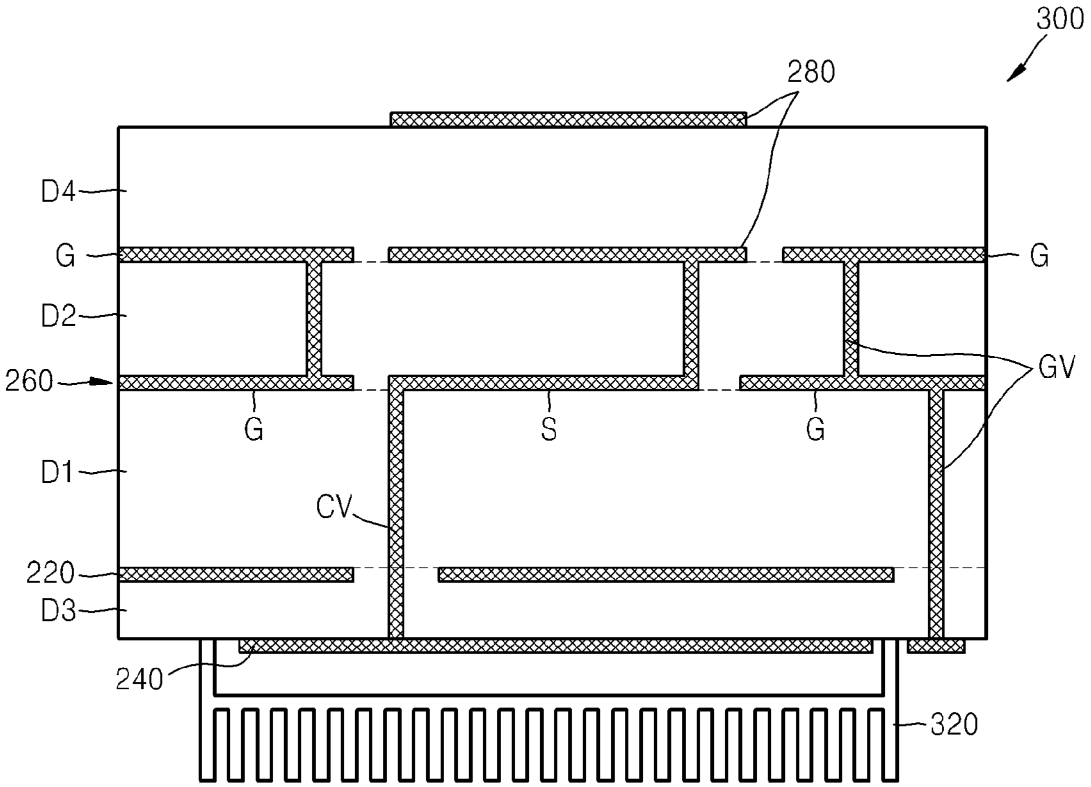
FIG. 8 is a cross-sectional view illustrating a schematic structure of a multilayered antenna package according to another exemplary embodiment.

FIG. 8 is a cross-sectional view illustrating a schematic structure of a multilayered antenna package according to another exemplary embodiment.

As shown in FIG. 8, a multilayered antenna package 300 is different from the multilayered antenna package 200 of FIG. 5 in that a heat sink 320 bonded to a lower surface of a third dielectric layer D3 is further included. The heat sink 320 may be formed of a metal having good thermal conductivity, and may include a plurality of heat dissipation pins to increase heat radiation efficiency, as illustrated in FIG. 8. However, the form of the heat sink 320 is not limited to the one illustrated.

According to the multilayered antenna package of the exemplary embodiments described above, the number of stacked layers is minimized so that a broadband signal may be transmitted wirelessly.

According to the multilayered antenna package of the exemplary embodiments described above, loss is reduced during signal transmission and manufacturing costs are low.

While exemplary embodiments have been particularly shown and described, it will be understood by those of ordinary skill in the art that various changes in form and details may be made therein without departing from the spirit and scope of the inventive concept as defined by the following claims.

What is claimed is:

1. A multilayered antenna package comprising:

a radio frequency integrated circuit (RFIC) interface layer that is configured to transmit a radio frequency (RF) signal;

a first dielectric layer that is disposed directly on a surface of the RFIC interface layer;

a coplanar waveguide layer that is disposed above the first dielectric layer and is configured to receive the RF signal transmitted by the RFIC interface layer;

a second dielectric layer disposed on the coplanar waveguide layer; and an antenna portion that is disposed on the second dielectric layer and is configured to irradiate a signal that is transmitted from the coplanar waveguide layer, wherein the coplanar waveguide layer comprises a signal line and a grounding portion, and the signal line and the grounding portion are disposed on a same plane above the first dielectric layer, wherein the RFIC interface layer and the antenna portion function as shields to the coplanar waveguide layer.

2. The multilayered antenna package of claim 1, wherein the grounding portion is separated from the signal line.

3. The multilayered antenna package of claim 2, wherein the grounding portion surrounds the signal line with an interval from the signal line.

4. The multilayered antenna package of claim 2, wherein a first end of the signal line is electrically coupled to the RFIC interface layer, and a second end of the signal line is electrically coupled to the antenna portion.

5. The multilayered antenna package of claim 4, wherein the first dielectric layer is disposed on an upper surface of the RFIC interface layer, and the multilayered antenna package further comprises a conductive via that passes through the first dielectric layer to connect the first end of the signal line to the RFIC layer.

6. The multilayered antenna package of claim 5, further comprising:

a third dielectric layer disposed under the RFIC interface layer; and a power line disposed on a lower surface of the third dielectric layer.

7. The multilayered antenna package of claim 6, wherein the first dielectric layer, the second dielectric layer, and the third dielectric layer are formed of a FR4 material.

8. The multilayered antenna package of claim 4, further comprising:

a power line disposed on the first dielectric layer; and a third dielectric layer disposed on the power line, wherein the power line and the third dielectric layer are interposed between the coplanar waveguide layer and the first dielectric layer.

9. The multilayered antenna package of claim 8, further comprising a conductive via that passes through the first dielectric layer and the third dielectric layer to connect the RFIC interface layer and the first end of the signal line.

10. The multilayered antenna package of claim 8, wherein the first dielectric layer, the second dielectric layer, and the third dielectric layer are formed of a FR4 material.

11. The multilayered antenna package of claim 2, wherein the signal line supplies a signal from the RFIC interface layer to the antenna portion via a direct feeding method or a coupling feeding method.

12. The multilayered antenna package of claim 1, wherein the antenna portion is configured to irradiate a signal of a millimeter wavelength band.

13. The multilayered antenna package of claim 1, wherein the antenna portion comprises an array of a plurality of antennas.

14. The multilayered antenna package of claim 13, wherein the coplanar waveguide layer comprises a plurality of signal lines corresponding to the plurality of antennas and the grounding portion formed to surround the plurality of signal lines with an interval from the plurality of signal lines.

15. The multilayered antenna package of claim 1, further comprising a heat sink.

16. A multilayered antenna package comprising:

a first dielectric layer;

a coplanar waveguide layer disposed directly on an upper surface of the first dielectric layer;

a radio frequency integrated circuit (RFIC) interface layer that is disposed directly on a lower surface of the first dielectric layer;

at least one first connection via that electrically connects the RFIC interface layer to the coplanar waveguide layer through the first dielectric layer;

a second dielectric layer disposed directly on an upper surface of the coplanar waveguide layer;

an antenna portion that is disposed directly on an upper surface of the second dielectric layer; and at least one second connection via that electrically connects the coplanar waveguide layer to the antenna portion through the second dielectric layer, wherein the coplanar waveguide layer comprises a signal line and a grounding portion, and the signal line and the grounding portion are disposed on a same plane of the first dielectric layer, wherein the RFIC interface layer and the antenna portion function as shields to the coplanar waveguide layer.

17. The multilayered antenna package according to claim 16, wherein the ground that surrounds the signal line, and the first connection via is electrically connected to a first end of the signal line, and the second connection via is electrically connected to a second end of the signal line.

18. The multilayered antenna package according to claim 16, further comprising:

a third dielectric layer disposed directly on a lower surface of the RFIC layer;

a power line disposed directly on a lower surface of the third dielectric layer; and at least one third connection via that electrically connects the power line to the RFIC layer through the third dielectric layer.

* * * * *